United States Patent
Huang et al.

(10) Patent No.: US 8,264,290 B2
(45) Date of Patent: Sep. 11, 2012

(54) DUAL POSITIVE-FEEDBACKS VOLTAGE CONTROLLED OSCILLATOR

(75) Inventors: Zue-Der Huang, Hsinchu (TW); Chung-Yu Wu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 98 days.

(21) Appl. No.: 12/805,572

(22) Filed: Aug. 6, 2010

(65) Prior Publication Data

US 2011/0273239 A1    Nov. 10, 2011

(30) Foreign Application Priority Data

May 4, 2010   (TW) .............................. 99109575 A

(51) Int. Cl.
*H03B 5/12*    (2006.01)
(52) U.S. Cl. ............... 331/117 FE; 331/167; 331/117 R
(58) Field of Classification Search .................. 331/167, 331/117 R, 117 FE
See application file for complete search history.

(56) References Cited

U.S. PATENT DOCUMENTS

| | | | | |
|---|---|---|---|---|
| 2011/0018646 A1* | 1/2011 | Lee et al. | ................ | 331/117 FE |
| 2011/0156829 A1* | 6/2011 | Wang | ....................... | 331/117 FE |
| 2011/0248787 A1* | 10/2011 | Jiang | ....................... | 331/117 FE |

* cited by examiner

*Primary Examiner* — Joseph Chang
(74) *Attorney, Agent, or Firm* — Bacon & Thomas, PLLC

(57) ABSTRACT

A dual positive-feedbacks voltage controlled oscillator includes an oscillation circuit and a cross coupled pair circuit. The oscillation circuit includes a first transistor, a second transistor, an inductor and a plurality of capacitors. The gates of the first and second transistors are opposite to each other and coupled to two points of the inductor. The inductor and the capacitors are formed as a LC tank. The cross coupled pair circuit includes a third transistor and a fourth transistor. The gates of the third and fourth transistors are cross coupled to two points of the inductor. Thereby, the gate of the third transistor is coupled to the gate of the second transistor; the gate of the fourth transistor is coupled to the gate of the first transistor; the drain of the third transistor is coupled to the source of the first transistor; and the drain of the fourth transistor is coupled to the source of the second transistor.

6 Claims, 1 Drawing Sheet

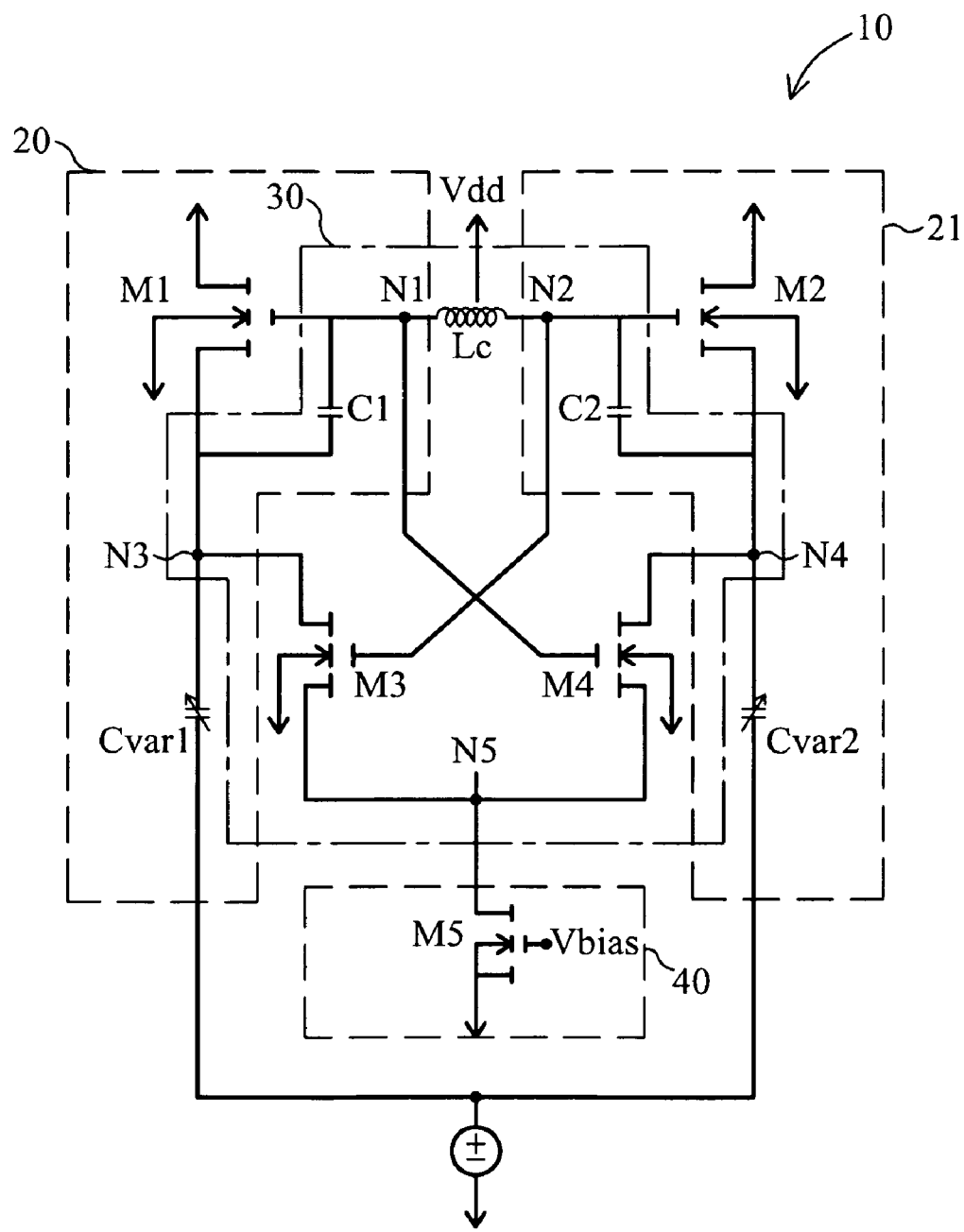

DUAL POSITIVE-FEEDBACKS VOLTAGE CONTROLLED OSCILLATOR

BACKGROUND OF THE INVENTION (1) Field of the Invention

The invention relates to a voltage controlled oscillator, and especially relates to a dual positive-feedbacks voltage controlled oscillator for improving the efficiency of the voltage controlled oscillator in the microwave band at the performance of the low supply voltage.

(2) Description of the Prior Art

With the wireless communication technology flourishing, the quality determinant of the receiver transmitter applied in the wireless communication system is decided by the quality of variable frequency signal generated from the voltage controlled oscillator (VCO). Otherwise, the voltage controlled oscillator is usually applied in signal generator The VCO is an electronic oscillator designed to be controlled in the oscillation frequency by a voltage input. The frequency of oscillation is varied by the applied direct-current (DC) voltage, while the modulating signals is also able to be fed into the VCO to cause the frequency modulation.

However, the conventional voltage controlled oscillator designed at the standard voltage uses a negative resistance generating circuit for offsetting the parasitic resistance of the inductor-capacitor (also commonly LC) tank, and the negative resistance generating circuit is such as n-type metal-oxide-semiconductor field effect transistors (also commonly NMOS or p-type metal-oxide-semiconductor field effect transistors (also commonly PMOS) cross-coupled pair circuit, single-ended oscillation circuit or Colpitts circuit; otherwise, the conventional voltage controlled oscillator uses a dual negative resistance generating circuit such as complementary cross coupled pair circuit with NMOS-PMOS structure, so the circuit type of the dual negative resistance generating circuit is not in accordance with the design of the low voltage. Therefore, said methods need a large direct current for offsetting in the design of the low voltage, so the power consumption is raised. Otherwise, due to the low voltage, the signal to noise ratio (SNR) of said voltage controlled oscillators is decreased, and the performance of the phase noise is in attenuation.

Consequently, how to decrease the phase noise and the power of the VCO at the operation of the low voltage is an important issue.

SUMMARY OF THE INVENTION

The object of the invention is to provide an oscillation circuit and a cross coupled pair circuit for improving the efficiency of the voltage controlled oscillator in the microwave band at the performance of the low supply voltage.

Another object of the invention is to provide an oscillation circuit and a cross coupled pair circuit for generating dual negative resistances at the smaller consumption of the direct current to save more power.

In one aspect, the invention provides a dual positive-feedbacks voltage controlled oscillator includes an oscillation circuit and a cross coupled pair circuit.

The oscillation circuit includes a first transistor, a second transistor, an inductor and a plurality of capacitors. The gate of the first transistor and the gate of the second transistor are opposite to each other and coupled to two points of the inductor. The inductor and the capacitors are formed as a LC tank. The capacitors of the LC tank includes a first capacitor electrically connected to a first output of the oscillation circuit and the source of the first transistor; a second capacitor electrically connected to a second output of the oscillation circuit and the source of the second transistor; a first variable capacitor electrically connected to the drain of the third transistor and the ground; and a second variable capacitor electrically connected to the drain of the fourth transistor and the ground.

The cross coupled pair circuit includes a third transistor and a fourth transistor. The gate of the third transistor and the gate of the fourth transistor are cross coupled to two points of the inductor, and the gate of the third transistor is coupled to the gate of the second transistor and the gate of the fourth transistor is coupled to the gate of the first transistor. The drain of the third transistor is coupled to the source of the first transistor, and the drain of the fourth transistor is coupled to the source of the second transistor. The source of the third transistor and the source of the fourth transistor are grounded.

In an embodiment further includes a voltage source offering a supply voltage. The drain of the first transistor, the drain of the second transistor and the inductor are coupled with the voltage source.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

FIG. 1 is a schematic view of the circuit diagram of a dual positive-feedbacks voltage controlled oscillators.

DESCRIPTION OF THE PREFERRED EMBODIMENTS

It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and "coupled," and variations thereof herein are used broadly and encompass direct and indirect connections, couplings, and mountings.

Refer to FIG. 1 for the schematic view of the circuit diagram of a dual positive-feedbacks voltage controlled oscillator 10. The dual positive-feedbacks voltage controlled oscillator 10 includes an oscillation circuit and a NMOS cross coupled pair circuit 30. The oscillation circuit includes a first transistor M1, a second transistor M2, an inductor Lc and a plurality of capacitors C1, C2, Cvar1 and Cvar2. The oscillation circuit is composed of two complementary Colpitts circuit 20 and 21, and the inductor Lc is shared between two Colpitts circuit 20 and 21. The NMOS cross coupled pair circuit 30 includes a third transistor M3 and a fourth transistor M4.

Two Colpitts circuit 20 and 21 and the NMOS cross coupled pair circuit 30 are cascaded, so the direct-current (DC) biasing currents on two Colpitts circuit 20 and 21 and the NMOS cross coupled pair circuit 30 are on the same current path, and, the direct current is shared by two Colpitts circuit 20 and 21 and the NMOS cross coupled pair circuit 30 to save the power. Said first transistor M1, said second transistor M2, said third transistor M3 and said fourth transistor M4 are the n-type field effect transistors.

A LC tank includes the inductor Lc and the capacitors C1, C2, Cvar1 and Cvar2, and the oscillation frequency of the dual positive-feedbacks voltage controlled oscillator 10 is controlled by the LC tank.

In an embodiment, a voltage source offers a supply voltage Vdd. The drain of the first transistor M1, the drain of the second transistor M2 and the inductor Lc are coupled with the voltage source. The gate of the first transistor M1 and the gate of the second transistor M2 are opposite to each other and coupled to two points N1 and N2 of the inductor Lc. The gate of the third transistor M3 and the gate of the fourth transistor M4 are respectively cross coupled to two points N2 and N1 of the inductor Lc and biased at the supply voltage Vdd. With the cascade structure of two Colpitts circuit 20 and 21 and the NMOS cross coupled pair circuit 30, the required voltage headroom of the circuit is able to be reduced to get the object of the low supply voltage. Therefore, the gate of the third transistor M3 is coupled to the gate of the second transistor M2 via the point N2, and the gate of the fourth transistor M4 is coupled to the gate of the first transistor M1 via the point N1. The drain of the third transistor M3 is coupled to the source of the first transistor M1 via the point N3, and the drain of the fourth transistor M4 is coupled to the source of the second transistor M2 via the point N4. The source of the third transistor M3 and the source of the fourth transistor M4 are coupled to the point N5.

Otherwise, a first capacitor C1 of the LC tank is electrically connected to a first output of the oscillation circuit and the source of the first transistor M1; a second capacitor C2 is electrically connected to a second output of the oscillation circuit and the source of the second transistor M2; a first variable capacitor Cvar1 is electrically connected to the drain of the third transistor M3 and the ground; and a second variable capacitor Cvar2 is electrically connected the drain of the fourth transistor M4 and the ground.

In an embodiment, a fifth transistor M5 is further included as a current source 40. The drain of the fifth transistor M5 is coupled with the source of the third transistor M3 and the source of the fourth transistor M4. The current source 40 offers a DC biasing current via the bias voltage Vbias to two Colpitts circuit 20 and 21 and the NMOS cross coupled pair circuit 30. The flow of the direct current is controlled by the fifth transistor M5 for applying to any specifications for all sorts of circuits.

In another embodiment, by taking apart the fifth transistor M5, the source of the third transistor M3 and the source of the fourth transistor M4 are grounded via the point N5, so the bias voltage Vbias is zero. Thus, total power of the dual positive-feedbacks voltage controlled oscillator 10 is decreased.

Two Colpitts circuit 20 and 21 offer a first positive-feedback loop, and the first positive-feedback loop is equivalent to a first negative resistance. The NMOS cross coupled pair circuit 30 with the third transistor M3 and the fourth transistor M4 offers a second positive-feedback loop, and the second positive-feedback loop is equivalent to a second negative resistance. Said two negative resistances, which are generated by two Colpitts circuit 20 and 21 and the NMOS cross coupled pair circuit 30, are connected in parallel with a parasitic resistance of the LC, tank. Hence, two negative resistances offset the parasitic resistance of the LC tank.

Because two negative resistances are generated by two Colpitts circuit 20 and 21 and the NMOS cross coupled pair circuit 30, a high negative resistance is generated by the dual positive-feedbacks voltage controlled oscillator 10 in the operation of the low voltage and in the share of the direct current. So the dual positive-feedbacks voltage controlled oscillator 10 is able to be oscillated under the smaller power. Otherwise, in the dual positive-feedback loops of two Colpitts circuit 20 and 21 and the NMOS cross coupled pair circuit 30, the equivalent loop gain of the oscillation is circuit is raised to increase the output signal amplitude for improving the phase noise.

Above all, said embodiments has following advantages:

1. By the signal symmetry of two complementary Colpitts circuit 20 and 21, the phase noise of the dual positive-feedbacks voltage controlled oscillator 10 is decreased in the microwave band.

2. By the NMOS cross coupled pair circuit 30, the total power of the dual positive-feedbacks voltage controlled oscillator 10 is decreased in the microwave band.

3. By the signal symmetry of two complementary Colpitts circuit 20 and 21 and the NMOS cross coupled pair circuit 30, the supply voltage of the dual positive-feedbacks voltage controlled oscillator 10 is decreased in the microwave band.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A dual positive-feedbacks voltage controlled oscillator, comprising:
    an oscillation circuit, including a first transistor, a second transistor, an inductor and a plurality of capacitors, and the gate of the first transistor opposite to the gate of the second transistor, and the gates of the first and second transistors being respectively coupled to two points of the inductor, wherein the inductor and the capacitors are formed as a LC tank; and a cross coupled pair circuit, including a third transistor and a fourth transistor, the gate of the third transistor and the gate of the fourth transistor cross coupled to the two points of the inductor, the gate of the third transistor coupled to the gate of the second transistor, the gate of the fourth transistor coupled to the gate of the first transistor, the drain of the third transistor directly coupled to the source of the first transistor, and the drain of the fourth transistor directly coupled to the source of the second transistor.

2. The dual positive-feedbacks voltage controlled oscillators of claim 1 further comprising a voltage source offering a supply voltage, wherein the drain of the first transistor, the drain of the second transistor and the inductor are coupled with the voltage source.

3. The dual positive-feedbacks voltage controlled oscillators of claim 1, wherein the capacitors of the LC tank comprises:
- a first capacitor, electrically connected between a first output of the oscillation circuit and the source of the first transistor;
- a second capacitor, electrically connected between a second output of the oscillation circuit and the source of the second transistor;
- a first variable capacitor, electrically connected between the drain of the third transistor and the ground; and
- a second variable capacitor, electrically connected between the drain of the fourth transistor and the ground.

4. The dual positive-feedbacks voltage controlled oscillators of claim 1, wherein the source of the third transistor and the source of the fourth transistor are grounded.

5. The dual positive-feedbacks voltage controlled oscillators of claim 1 further comprising a fifth transistor as a current source offering a bias current to the oscillation circuit and the cross coupled pair circuit, and the drain of the fifth transistor is coupled with the source of the third transistor and the source of the fourth transistor.

6. The dual positive-feedbacks voltage controlled oscillators of claim 1, wherein the first transistor, the second transistor, the third transistor and the fourth transistor are the n-type field effect transistors.

* * * * *